United States Patent [19]

Brunet et al.

[11] Patent Number: 5,508,659
[45] Date of Patent: Apr. 16, 1996

[54] SINGLE LOOP FREQUENCY SYNTHESIZER WITH DIRECT DIGITAL SYNTHESIS

[75] Inventors: Elie Brunet, Verrieres le Buisson; Jean-Noel Brasselet, Houx/Maintenon; Eric Souchard, Chatillon s/s Bagneux, all of France

[73] Assignee: Thomson-CSF, Paris, France

[21] Appl. No.: 364,988

[22] Filed: Dec. 28, 1994

[30] Foreign Application Priority Data

Dec. 28, 1993 [FR] France .................. 93 15741

[51] Int. Cl.$^6$ .................. H03L 7/08; H03L 7/16; H03L 7/18
[52] U.S. Cl. .................. 331/16; 331/18; 331/17; 331/14; 455/260; 327/105; 327/156
[58] Field of Search .................. 331/1 A, 2, 16, 331/17, 18, 22, 23, 25, 14; 455/260; 327/105, 156, 159

[56] References Cited

U.S. PATENT DOCUMENTS

| | | | |
|---|---|---|---|
| 4,464,638 | 8/1984 | Crowley et al. | 331/1 A |
| 4,882,549 | 11/1989 | Galani et al. | 331/16 X |
| 5,015,971 | 5/1991 | Taylor et al. | 331/16 |
| 5,019,790 | 5/1991 | Kapetanic | 331/16 |
| 5,023,572 | 6/1991 | Caldwell et al. | 331/16 X |
| 5,184,093 | 2/1993 | Itoh et al. | 331/25 |

OTHER PUBLICATIONS

Thomas J. Endres, et al., "Induced End–of–Life Errors in a Fast Settling PLL", 1993 IEEE International Frequency Control Symposium, 1993, pp. 261–269.

*Primary Examiner*—David Mis
*Attorney, Agent, or Firm*—Oblon, Spivak, McClelland, Maier & Neustadt

[57] ABSTRACT

A frequency synthesizer with very short acquisition times. With a single loop there is associated a direct digital synthesizer whose signal is injected into the loop by means of a mixer. The adjustment of the loop is done on Np.Fr and the adjustment of the digital synthesis is done on $(Ns+K/M)Fr$ with Np, Ns, K and M as integers, Np being greater than Ns, $0 \leq K < M$, M as a fixed value and where Fr is a reference frequency. The mixture makes it possible to obtain, as a synthesis frequency, $(Ns+Np+K/M)Fr$. The acquisition time of the digital synthesis is negligible and that of the loop is greatly reduced since it synthesizes steps that are multiples of Fr and not of $Fr/M$ as with a standard single loop.

5 Claims, 4 Drawing Sheets

– 1 –

SINGLE LOOP FREQUENCY SYNTHESIZER WITH DIRECT DIGITAL SYNTHESIS

BACKGROUND OF THE INVENTION

The present invention relates to phase-lock frequency synthesizers and more particularly relates to single-loop synthesizers.

Frequency synthesizers are known. They are used especially in radiocommunications as a source of the radiofrequency signal in the transmission circuitry and as a local transposition oscillator in the reception circuitry. In frequency-hopping radiocommunications systems where the frequency is changed according to a certain rate and a certain relationship, the rate of change of frequency, quantified in terms of number of hops per second, is limited by the reverse of the time taken by the synthesizer to go from one frequency to another frequency. The need for ever faster synthesizers has led to the making of multiple-loop synthesizers, for example synthesizers with three loops: a main loop that generates a first signal whose frequency may vary in steps of, for example, 1 MHz or more, a secondary loop with an output divider that generates a second signal whose frequency and steps of variation can be adjusted independently of those of the first signal and are, for example, about fifty times smaller because of the division by the output divider and an addition loop that takes the sum of the first signal and the second signal. The drawback of these multiple-loop synthesizers is that they call for a far greater number of variable oscillators. Thus, for a three-loop oscillator, it is necessary to have nine different oscillators to cover two octaves because one and the same oscillator cannot cover more than half an octave but in the secondary loop it is possible, instead of changing the oscillator, to change the division ratio of the output divider. Now, variable oscillators consume current, take up space, are costly and entail the risk of causing parasitic signals in the synthesizer if they are not sufficiently decoupled with respect to one another.

SUMMARY OF THE INVENTION

The present invention is aimed at preventing or, at least, at reducing these drawbacks.

This is obtained by associating a single loop with a direct digital synthesizer device and by the injection, into the single loop, by means of a mixer, of the signal prepared by the direct digital synthesizer device.

According to the present invention, there is provided a single-loop frequency synthesizer to give a synthesized frequency that can be written as $(N+K/M)Fr$ where Fr is a frequency, N, K and M are integers with N and M being positive numbers and K being smaller than M in absolute value, this synthesizer comprising a single loop, a reference oscillator to give a signal at the frequency Fr, a mixer having a first input and a second input and an output, the mixer having its first input and its output arranged serially in the loop, and a direct digital synthesizer device having an output connected to the second input of the mixer, the direct digital synthesizer device producing, from the signal at the frequency Fr, a signal at the frequency $(Ns+K/M)Fr$ where Ns is a positive integer smaller than N.

BRIEF DESCRIPTION OF THE DRAWINGS

The present invention will be understood more clearly and other characteristics shall appear from the following description and from the figures pertaining thereto, of which.

In the different figures, the corresponding elements are designated by the same references.

MORE DETAILED DESCRIPTION

Figure 1:
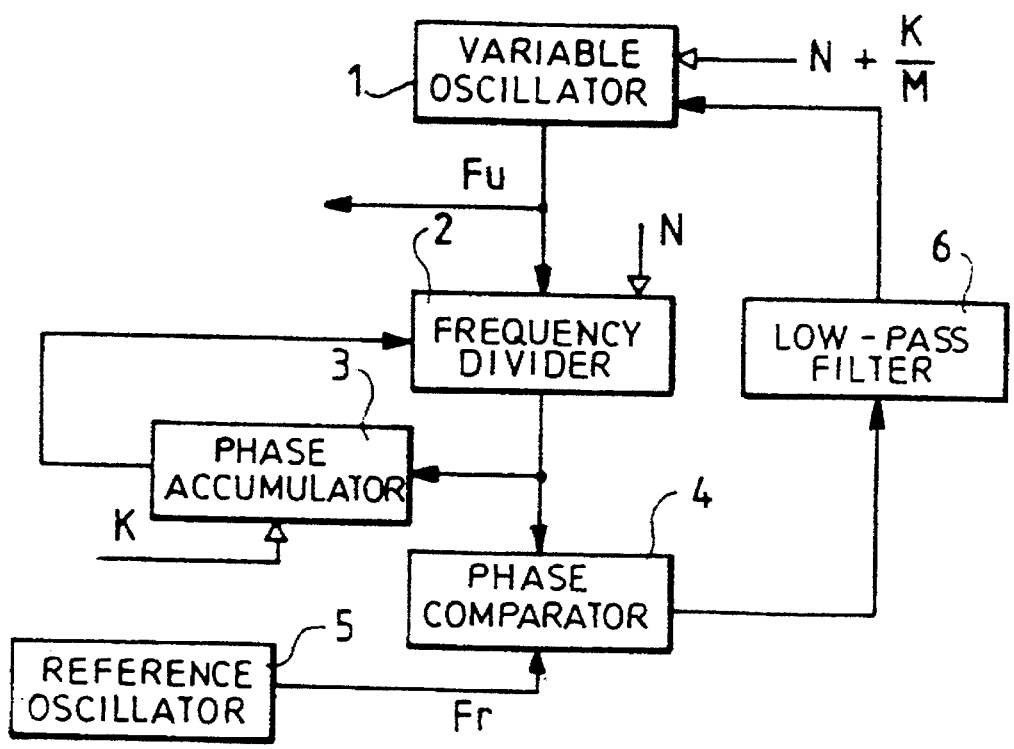
FIG. 1 shows a single-loop synthesizer according to the prior art.

FIG. 1 shows a single-loop frequency synthesizer according to the prior art. In this synthesizer, a variable oscillator 1 comprising a voltage pre-controlled input to which there is applied a voltage as a function of $N+K/M$ the meaning of which shall appear further below and a voltage control input gives a signal Fu at a signal output, this signal Fu constituting both the output signal of the synthesizer and the input signal for a frequency divider 2. The output of the frequency divider is connected to the second input of a phase comparator 4 which receives, at its first input, the frequency output signal Fr given by a reference oscillator 5. The oscillator 5 is constituted by a temperature-compensated quartz oscillator. The frequency divider 2 has a programming input to give its division ratio, a value N where N is a positive integer and a control input to make its division ratio go from the value N to the value N+1, depending on whether a 0 or a 1 is applied to this control input. A modulo M phase accumulator 3, where M is a positive integer greater than 1, couples the output of the divider 2 at its control input. The output of the phase comparator is coupled by a low-pass filter 6 to the control input of the variable oscillator 1.

The phase accumulator 3 has a control input to which there is applied a control code K representing an integer ranging from 0 to M−1. Thus controlled, the phase accumulator 3 delivers, at its output K, pulses for M periods of the output signal of the divider 2. Thus, when the synthesizer is synchronized, i.e. when the output signal of the divider 2 is at the frequency Fr of the output signal of the reference oscillator 5, the frequency Fr at the output of the divider 2 is equal to the input frequency Fu of the divider divided by $N+K/M$, which amounts to writing:

$$Fu=(N+K/M)Fr$$

Taking the frequency Fr to be the unit frequency, N represents the integer part of Fu and $K/M$ represents its fractional part. And the smallest increment or frequency step that can be obtained with the synthesizer according to FIG. 1 is $Fr/M$.

The acquisition of a frequency by the loop may be considered to be done in two successive steps: a first approach step having a duration t1, during which the control voltage of the variable oscillator varies substantially and a second phase-locking step having a duration t2, during which the variations of the control voltage of the variable oscillator are small. The pre-positioning of the control voltage of the variable oscillator makes it possible to make t1 tend towards 0. The duration t2 of the second period is a reverse function of the cut-off frequency of the loop and is chiefly related to the frequency $Fr/M$ and to the attenuation on this frequency. For example, with the following values:

$$Fr/M=25 \text{ kHz}=1/(40 \text{ μs})$$

80 dBc for the parasitic lines, namely 80 decibels of attenuation on the synthesis lines with respect to the frequency Fu signal which are usual values for this type of synthesizer, the acquisition time is in the range of 02 ms, giving 2000 μs/40 μs=50 times the period corresponding to the frequency step. An acquisition time such as this is far too long for many applications of the frequency synthesizers. To overcome this drawback, multiple-loop synthesizers have been designed with the drawbacks that have been indicated here above.

Figure 2:
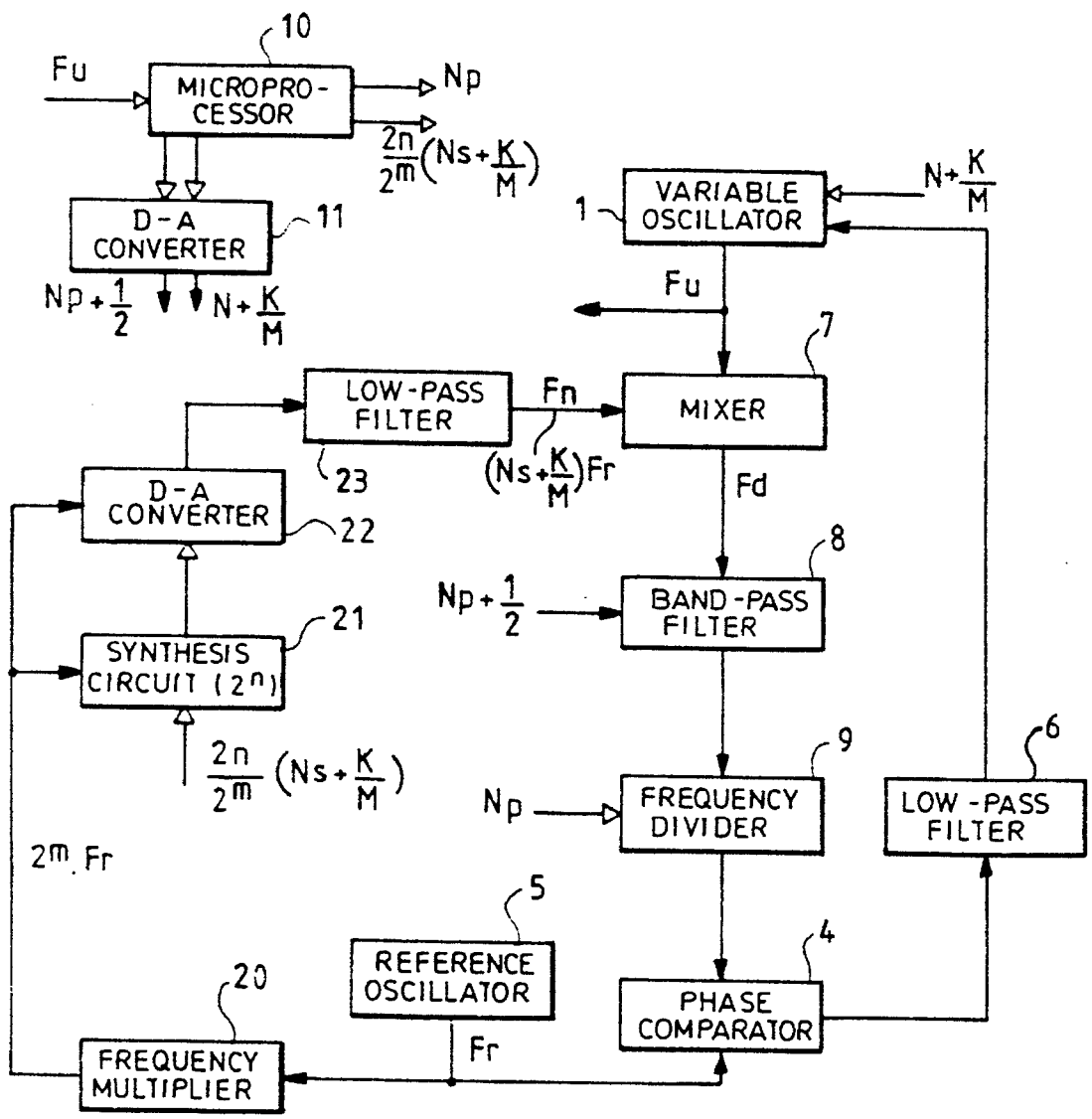
FIG. 2 shows a single-loop synthesizer according to the invention.

FIG. 2 shows a single-loop frequency synthesizer in which the loop prepares only frequency steps having a value equal to the reference frequency Fr while, outside the loop, far smaller frequency steps are prepared by digital synthesis. The single loop has the elements 1, 4, and 6 to 9 according to FIG. 2. The digital synthesis is done by means of the elements 21 to 23 of FIG. 2. This same figure shows a reference oscillator 5 that delivers a frequency Fr signal and a frequency multiplier 20 which receives a part of the signal with the frequency Fr to deliver a signal with a frequency $2^m$.Fr where m is a positive integer. The frequency $2^m$.Fr signal constitutes the clock signal for the digital synthesis.

The single loop according to FIG. 2 is differentiated from that of FIG. 1 in that:

the fractional division performed by the circuits 2, 3 is replaced by a division by a fixed integer ratio Np performed by a frequency divider 9 having an input for the control of its division ratio to which there is applied a code representing the value Np, the introduction between the signal output of the oscillator 1 and the divider 9 of a mixer 7 followed by a passband filter 8 that is adjusted as a function of the value Np+½.

The mixer 7 has a first input connected to the output of the oscillator 1, a second input and an output connected to a signal input of the filter 8. The passband filter 8 is formed by L-C cells, with varicap type variable capacitors. The centering of the passband of the filter is carded out by the pre-positioning in voltage of the varicaps.

The elements 21 to 23 that carry out the digital synthesis are conventionally formed by a direct digital synthesis circuit 21 followed by a digital-analog converter 22, itself followed by a low-pass filter 23 whose output is connected to the second input of the mixer 7.

The direct digital synthesis circuit 21, having a resolution $2^n$, has a clock signal input to receive the signal at the frequency $2^m$.Fr and a control input to receive a signal that can be written in the form $$\frac{2^n}{2^m}\left(Ns+\frac{K}{M}\right).$$

The significance of Ns, K and M shall appear hereinafter. The digital-analog converter 22 has one clock signal input to receive the signal at the frequency $2^m$.Fr.

The digital synthesis with digital-analog conversion and filtering thus described gives an analog signal at a frequency Fd at the output of the filter 23 with:

$$Fn=\left[\frac{2^n}{2^m}\left(Ns+\frac{K}{M}\right)\right]\frac{2^m}{2^n}Fr$$

$$Fn=\left(Ns+\frac{K}{M}\right)Fr$$

Letting Fu designate the desired frequency for the output signal of the variable oscillator 1 and Fd designate the output frequency of the mixer 7, there is obtained:

$$Fu=Fd+Fn$$

inasmuch as, at the output of the mixer, it is the frequency obtained by subtraction between the input frequencies that is used.

When the servo-control of the loop is obtained, the signals at the two inputs of the phase comparator 4 are at one and the same frequency, namely at the frequency Fr. Thus, given the division ratio Np of the divider 9, the frequency Fd may be written as Fd=Np.Fr.

The output frequency of the oscillator 1 can be written as:

$$Fu = Fd + Fn$$

$$= Np \cdot Fr + \left(Ns+\frac{K}{M}\right)Fr$$

$$= \left(Np+Ns+\frac{K}{M}\right)Fr$$

and taking Np+Ns=N $$Fu=(N+K/M)Fr$$

it is this same formula that gives Fu in the case of FIG. 1 and this is what explains the fact that the value to achieve the pre-positioning of the variable oscillator 1 of FIG. 2 has been referenced N+K/M.

As stated, the loop of FIG. 2 therefore prepares only steps having a value Fr in contrast with steps having a value Fr/M for the loop according to FIG. 1 which means that the loop according to FIG. 2 has an acquisition time that is M times shorter than the loop according to FIG. 1. It must be noted, in this respect, that the value M to be taken into account is the value in the synthesizer according to FIG. 2 and that it is appreciably greater than in the case of FIG. 1 where, according to the exemplary embodiment referred to, it was only 40. In the exemplary embodiment according to FIG. 2, M will be equal to $2^{27}$.

It must also be noted that, since the acquisition time of the digital synthesis is extremely small, of the order of less than about ten clock cycles, namely in the example described of the order of less than about ten periods of the signal at the frequency $2^m$.Fr, this acquisition time may practically be overlooked with respect to the acquisition time of the loop.

It must be noted that an entirely digital design of the synthesis cannot be envisaged for frequencies greater than some tens of megahertz. There are two reasons for this:

current technological limits: digital-analog converters at frequencies of about 1 gigahertz and more have a resolution of less than or equal to 5 bits which corresponds to about 5×6=30 dBc for the parasitic lines, namely 30 decibels of attenuation on the parasitic lines with respect to the useful frequency signal. By contrast for a synthesis of a frequency of the order of 10 MHz, there are digital-analog converters having a resolution of 12 bits, namely about 12×6=72 dBc for the parasitic lines, the spectral quality required of the synthesizers in wideband phase noise, also called the noise floor, is of the order of 170 dBc. Now, digital synthesis comes up against the noise of its own technology for this noise is, at best, in the range of 130 to 140 dBc.

The numerical example examined here below will make it possible to specify the working of the Synthesizer according to FIG. 2.

The starting values are: a reference frequency Fr=1 MHz and a resolution of $2^n=2^{32}$ which is a standard value for commercially available direct digital synthesizer circuits. The aim to be achieved is that of servo-controlling the oscillator 1 in its operating frequency band.

Since, as we have seen, the loop is capable only of achieving steps having a value Fr=1 MHz by modification of the integer value of the division ratio Np of the divider 9, the intermediate values are obtained by digital synthesis which gives the signal Fn. For this purpose, the circuits 21, 22 have been chosen to be capable of working between 8 and 9 MHz, since other operating band values would also have been appropriate on condition that the band chosen extended over at least 1 MHz. With Fn ranging, in the example described, from 8 to 9 MHz, the clock frequency $2^m$.Fr should be at least twice according to Shannon, namely there should be:

$$2^m.1 \text{ MHz} \geq 9 \text{ MHz}$$

This condition is largely met in the example described where m=5, which gives $2^m$=32. Thus since the digital synthesis makes it possible to carry out steps of $$\frac{2^m}{2^n} Fr,$$

to make full use of it, M is taken to be equal to $2^{n-m}=2^{27}$.

Let it be assumed that the task now is to prepare a signal Fu within the frequency band of the oscillator 1, having for example the value of 225.512 MHz. Np will be taken to be equal to 217 so that the frequency Fn to be prepared by digital synthesis has a value of 8.512 MHz in the 8–9 MHz band. The values that remain to be determined are the values Ns and K of the single-loop synthesizer according to FIG. 2.

For Fu=217 MHz+8 MHz=225 MHz, the frequency Fn is equal to 8 MHz and K is equal to 0, which makes it possible to write:

$$Fn=8 \text{ MHz}=Ns.1 \text{ MHz}$$

whence Ns=8.

It must be noted that, in general, Ns will be smaller than Np and therefore smaller than N, the digital synthesis being used at frequencies appreciably below the frequencies prepared in the loop of the synthesizer.

For Fu=225,512 MHz, Ns is always equal to 8 and the fractional part of Fu is given by the term in K/M:

$$0.512 \text{ MHz} = \frac{K}{2^{27}} .1 \text{ MHz}$$

giving K=0.512×$2^{27}$, i.e. the control signal of the circuit 21 is given by: $2^{27}(8+0.512)$ The different values needed for the operation of the single-loop synthesizer that has just been described are computed by a microprocessor 10 as a function of the frequency Fu to be obtained. This microprocessor gives the digital values $$\frac{2^n}{2^m}\left(Ns+\frac{K}{M}\right),$$

Np, Np+½ and N+K/M and a digital-analog converter 11 converts Np+½ and N+K/M into analog values.

It must be noted that the passband filter 8 has its frequency band centered on (Np+½)Fr, namely on the first order lower beat between Fu and Fn in order to eliminate all the other products of mixing by the mixer 7 and hence to enable efficient operation of the divider 9. Should the loop have used the frequency Fd=Fu+Fn, the filter would have been centered on (Np−½)Fr.

Figure 3:
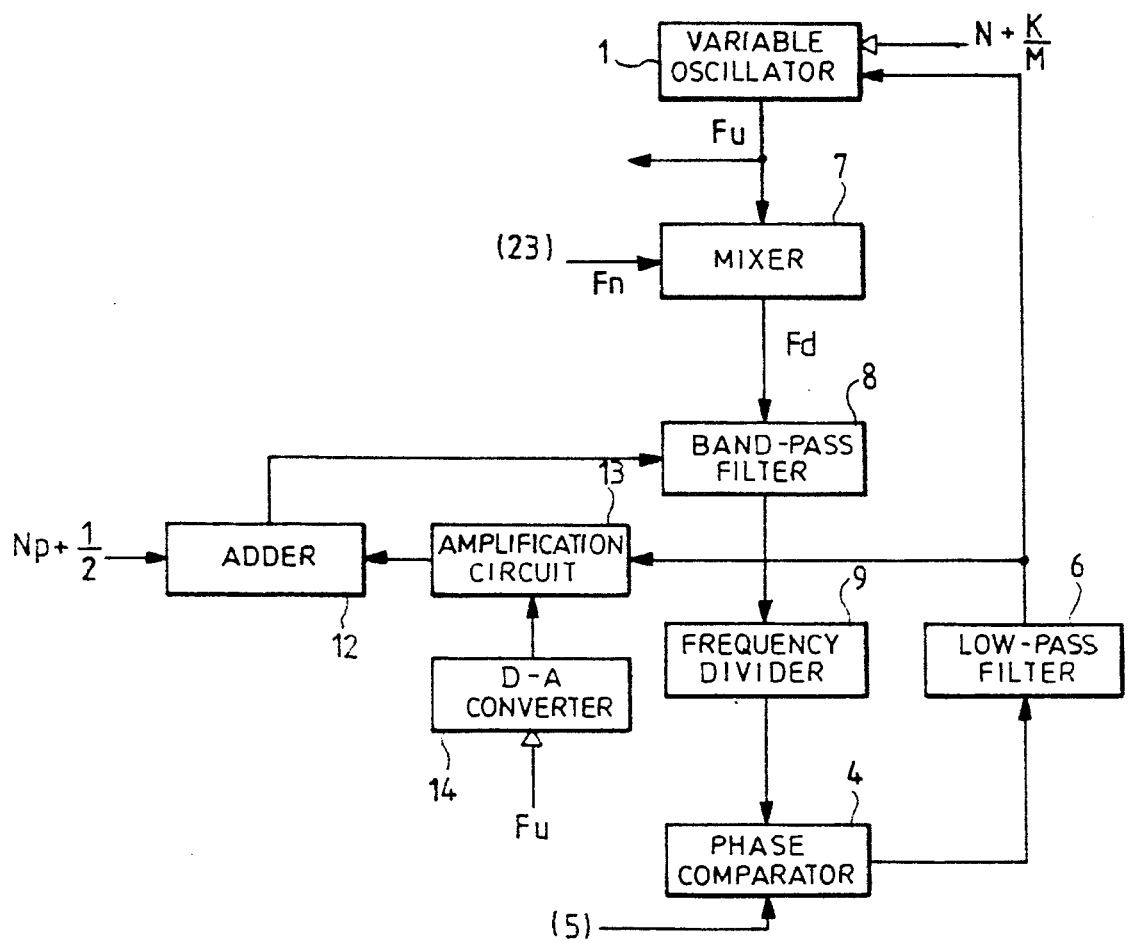
FIGS. 3 and 4 show details of embodiments pertaining to variants to the synthesizer according to FIG. 2.

The working of the synthesizer according to FIG. 2 means that the divider 9 should never be "blind", i.e. it should always receive an input signal. It is possible to obtain this result by taking a certain number of precautions:

the making of the oscillator 1 and of the filter 8 so that their temperature drifts compensate for each other, the pre-positioning of the oscillator 1 and of the filter 8 on the basis of one and the same digital-analog converter. Should these precautions be insufficient, the diagram according to FIG. 2 can be modified as indicated in FIG. 3. The modification consists in seeing to it that the pre-positioning of the passband filter 8 depends on the control voltage of the oscillator 1. For this purpose, the control signal of the filter 9 is obtained at the output of a two-input analog adder 12 which receives, at its first input, the analog signal (Np+½) and, at its second input, the output signal of a variable gain amplifier circuit 13. The circuit 13 has one signal input connected to the output of the low-pass filter 6 and one control input connected to the output of a digital-analog converter 14 which receives, at its input, the digital value Fu corresponding to the frequency to be obtained. The transfer function of the digital-analog converter 14 is set up during the final setting of the synthesizer.

Figure 4:
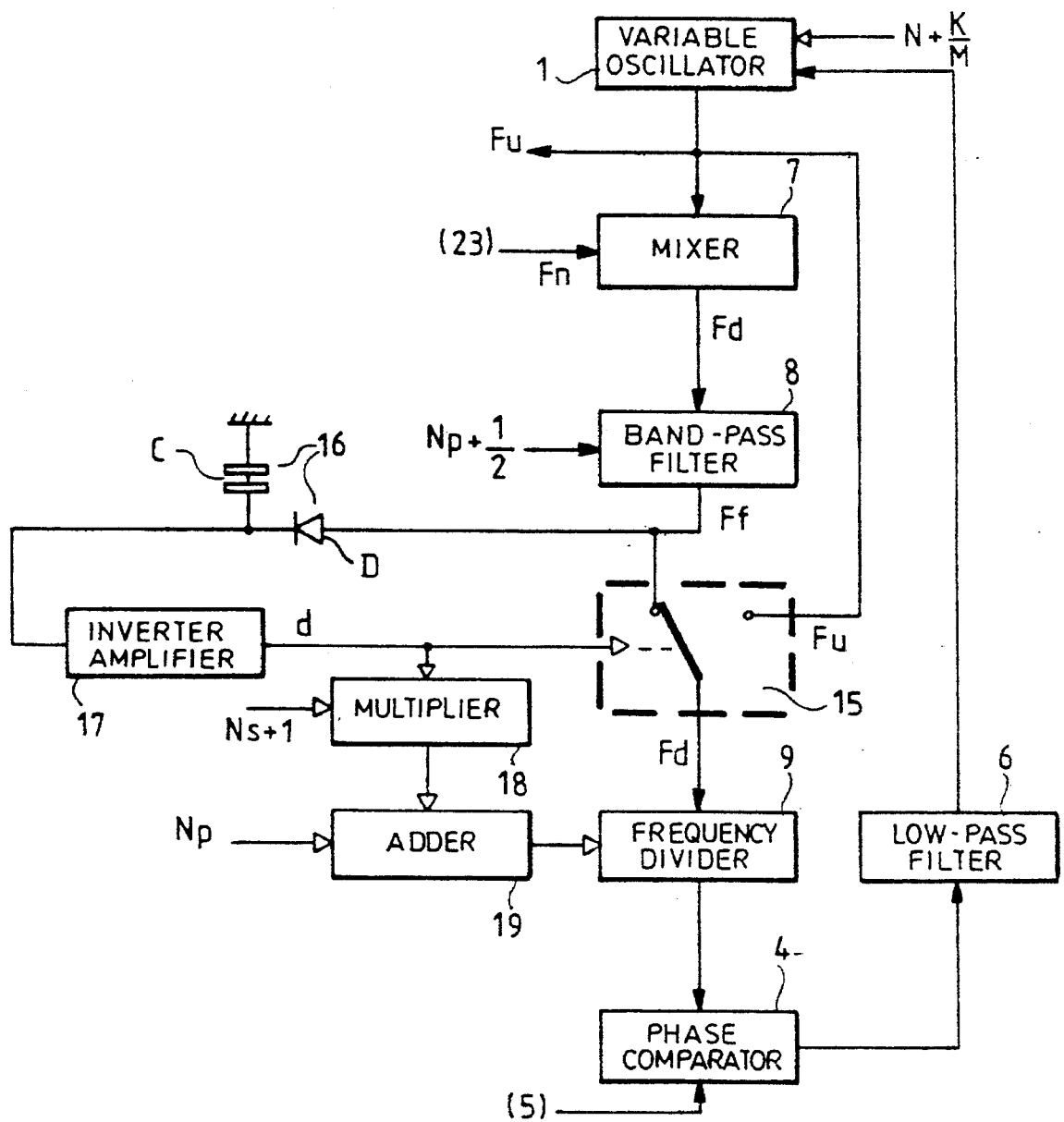

In addition to or independently of the precautions referred to further above and of the variant according to FIG. 3, FIG. 4 proposes another modification to the diagram of FIG. 2 to prevent the divider 9 from being "blind". This modification consists in directly connecting the output of the oscillator 1 to the input of the divider 9 so long as the filter 8 does not give any output signal and, during this preliminary step which shall be called an approach step, in giving the divider 9 a division ratio equal to Np+Ns+1. Thus, given the approach step, the signal with a frequency Fn prepared by the digital synthesis is not taken into account in the loop of the synthesizer and this loop tends to produce a signal Fu at a frequency (Np+Ns+1)Fr.

As can be seen in FIG. 4, the modifications to be made to the synthesizer according to FIG. 2 to perform an approach step in order to bring the oscillator 1 into a range of efficient operation of the loop consists of:

the interposing, between the output of the filter 8 and the signal input of the divider 9, of a two-position electronic switch 15 whose first port, second port and common point are respectively connected to the output of the oscillator 1, the output of the filter 8 and the signal input of the divider 9. To make it easier to understand the drawing, the switch 15 has been shown as a two-position mechanical relay, the connecting, between the output of the filter 8 and the control input of the switch 15, of a level detector 16 followed by an inverter amplifier 17; in FIG. 4, the level detector 16 had been represented by a diode D series-connected in the link formed by the filter 8 and the inverter amplifier 17 followed by a capacitor C connected to the ground, the connecting of the output of the inverter amplifier 17 to the second input of a digital multiplier 18 which receives, at its first input, the digital signal Ns+1 produced by the microprocessor 10 according to FIG. 2, the connecting of the output of the multiplier 18 to the second input of a digital adder 19 which, at its first input, receives the digital signal Np produced by the microprocessor 10 and has its output connected to the control input of the digital ratio of the divider 9. Thus, the digital signal Np is no longer applied directly to the control input of the divider 9.

Hereinafter, Ff is the frequency of the signal at the output of the filter 8 and d is the output signal of the inverter amplifier 14, with d=1 when the level detector does not locate the presence of a high frequency signal at the output of the filter 8 and d=0 when it locates the presence of such a signal. The approach step is characterized by d=1. Now d=1 activates the switch 15 to apply the output signal Fu of the oscillator 1 directly to the input of the divider 9 without going through the mixer 7 and the filter 8. Similarly since d=1, the digital signal Ns+1 is applied by the multiplier 18 to the second input of the adder 19 and therefore the division ratio of the divider 9 is taken to Np+Ns+1 while it goes to the value Np after the approach step, namely when d goes to 0.

During the approach step, since the divider 9 directly receives the signal Fu and since its division ratio is Np+Ns+1, the effective frequency of the oscillator 1 tends towards (Ns+Np+1)Fr and, since Ff=Fu−Fn, the effective frequency of the signal at the output of the filter 8 tends towards:

$$(Np + Ns + 1)Fr - \left(Ns + \frac{K}{M}\right)Fr = \left(Np + \frac{M-K}{M}\right)Fr$$

with $0 \leq K \leq M-1$ as seen further above.

Thus, the oscillator 1 approaches its programmed value.

The difference ΔFu between the effective value and the programmed value of the frequency of the oscillator 1 tends towards the difference between the approach value and the programmed value of the frequency of the oscillator 1:

$$\Delta Fu \rightarrow$$

$$(Np + Ns + 1)Fr - \left(Np + Ns + \frac{K}{M}\right)Fr = Fr - \frac{K}{M}Fr$$

which gives rise to:

$$\frac{Fr}{M} \leq \Delta Fu \leq Fr \quad (1a)$$

and therefore:
$$0 < \Delta Fu \leq Fr \quad (2a)$$

the limit values of (1a) respectively correspond to K=M−1 and K=0.

Since Fu approaches its programmed value, the frequency of the high frequency signal at the output of the filter 8 approaches its final value Fd. The difference ΔFf between the effective value and the final value of the frequency at the output of the filter 8 tends towards the difference between the approach value and the final value of the output signal of the filter 8:

$$\Delta Ff \rightarrow \left(Np + \frac{M-K}{M}\right)Fr - Np \cdot Fr = \frac{M-K}{M} Fr$$

giving rise to:

$$\frac{Fr}{M} \leq \Delta Ff \leq Fr \quad (1b)$$

and therefore $0 < \Delta f \leq Fr \quad (2b)$ the limit values of (1b) correspond respectively to K=M−1 and K=0.

The frequency at the output of the filter 8 approaches its pre-positioning value. The difference ΔFp between the effective value and the pre-positioned value of the frequency at the output of the filter 8 therefore tends towards the difference between the approach value and the pre-positioned value of the frequency of the output signal of the filter 8:

$$\Delta Ff \rightarrow \left(Np + \frac{M-K}{M}\right)Fr -$$

$$\left(Np + \frac{1}{2}\right)Fr = \left(\frac{M-K}{M} - \frac{1}{2}\right)Fr$$

giving rise to:

$$-\frac{Fr}{2} + \frac{Fr}{M} \leq \Delta Fp \leq +\frac{Fr}{2} \quad (1c)$$

and therefore:

$$-\frac{Fr}{2} < \Delta Fp \leq +\frac{Fr}{2} \quad (2c)$$

the limit values of (1c) respectively correspond to K=M−1 and K=0.

Thus, the compensating capacity of the approach device corresponds to the frequency bared covered by a given pre-positioning, ±Fr/2, of the filter 8.

In fact, it is not necessary to reach these limits for, as soon as the level becomes sufficient at the output of the filter 8, the synthesizer gets reconfigured in its initial structure by the change-over of the switch 15 to the output of the filter 8.

Other different variants may be found without going beyond the scope of the invention. In particular, the elements of the assembly may be adjusted so that, in the loop, it is the component Fu+Fn of the output signal of the mixer 7 that is taken into account. And it must be noted that although, throughout the description, it has been assumed that K could vary from 0 to M−1, it is also possible, as is also the case with the loops according to FIG. 1, to give K an integer value that could vary from 0 to −M+1 provided that the other elements of the synthesizer are adjusted accordingly.

In general, the field of the invention extends to any single-loop synthesizer, whatever this loop may be, that comprises a frequency mixer and a direct digital synthesis device, whatever this device may be, wherein the mixer is inserted into the loop for the introduction therein of the signal prepared by the device.

The invention can be applied to electronic sets fitted out with synthesizers requiring great agility in the preparation of their output frequency.

What is claimed is:

1. A single-loop frequency synthesizer to give a synthesized frequency that can be written as (N+K/M)Fr where Fr is a frequency, N, K and M are integers with N and M being positive numbers and K being smaller than M in absolute value, this synthesizer comprising a single loop, a reference oscillator to give a signal at the frequency Fr, a mixer having a first input and a second input and an output, the mixer having its first input and its output arranged serially in the loop, and a direct digital synthesizer device having an output connected to the second input of the mixer, the direct digital synthesizer device producing, from the signal at the frequency Fr, a signal at the frequency (Ns+K/M)Fr where Ns is a positive integer smaller than N.

2. A synthesizer according to claim 1, comprising a variable oscillator having a control input, a mixer having a first input and a second input and in series in its loop a phase comparator having a first input to receive the signal with the frequency Fr and a second input, a low-pass filter having an output, the control input of the variable oscillator, the first input of the mixer, the mixer, an adjustable bandpass filter, an adjustable frequency divider and the second input of the comparator, said direct digital synthesizer device being connected to the second input of the mixer.

3. A synthesizer according to claim 2, wherein the adjustable filter is adjusted that is a function solely of the value Np, where Np=N−NS.

4. A synthesizer according to claim 2, wherein the adjustable filter is adjusted as a function of the value Np, where Np=N–Ns and of the value of the output signal of the low-pass filter and comprises, for this purpose, an adder having an output to control the adjustment of the adjustable filter, a first input to receive a signal that is a function of Np and a second input coupled to the output of the low-pass filter.

5. A synthesizer according to claim 2, comprising a first switching device to cut the loop between the adjustable bandpass filter and the divider and close the loop that is thus cut by a direct link between the oscillator and the divider, a second switching device to make the division ratio of the divider go from the value Np=N–Ns to a value as a function of N, and a level detector mounted downline with respect to the bandpass filter to control the first and second switching devices.

* * * * *